US012645388B2

(12) United States Patent
Kotra et al.

(10) Patent No.: US 12,645,388 B2
(45) Date of Patent: Jun. 2, 2026

(54) EFFICIENT MEMORY OPERATION USING A DESTRUCTIVE READ MEMORY ARRAY

(71) Applicant: Advanced Micro Devices, Inc., Santa Clara, CA (US)

(72) Inventors: Jagadish B. Kotra, Austin, TX (US); Divya Madapusi Srinivas Prasad, San Mateo, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 111 days.

(21) Appl. No.: 18/477,272

(22) Filed: Sep. 28, 2023

(65) Prior Publication Data

US 2025/0110655 A1     Apr. 3, 2025

(51) Int. Cl.
*G06F 3/06* (2006.01)
*G11C 11/22* (2006.01)
*H10B 53/30* (2023.01)

(52) U.S. Cl.
CPC .......... *G06F 3/0652* (2013.01); *G06F 3/0604* (2013.01); *G06F 3/0655* (2013.01); *G06F 3/0673* (2013.01); *G11C 11/221* (2013.01); *G11C 11/2273* (2013.01); *H10B 53/30* (2023.02)

(58) Field of Classification Search
CPC .... G06F 3/0652; G06F 3/0604; G06F 3/0655; G06F 3/0673; G11C 11/221; G11C 11/2273; G11C 11/2275; G11C 11/2293; H10B 53/30
See application file for complete search history.

(56) References Cited

U.S. PATENT DOCUMENTS

| | | | | |
|---|---|---|---|---|
| 2021/0366543 A1* | 11/2021 | Chia | ..................... | G11C 11/419 |
| 2021/0405901 A1* | 12/2021 | Oh | ........................ | G06F 3/0604 |
| 2022/0343962 A1* | 10/2022 | Trantham | .............. | G11C 17/12 |
| 2022/0405208 A1* | 12/2022 | Trantham | ........... | G06F 12/0888 |
| 2023/0169011 A1* | 6/2023 | Roberts | .............. | G06F 12/0862 |
| | | | | 711/137 |
| 2024/0323407 A1* | 9/2024 | Jun | ..................... | H04N 19/136 |

OTHER PUBLICATIONS

"CLZERO—x86", WikiChip [retrieved May 20, 2023]. Retrieved from the Internet <https://en.wikichip.org/wiki/x86/clzero>., 6 Pages.
"Sandia Labs News Releases", National Technology and Engineering Solutions of Sandia, LLC [retrieved May 20, 2023]. Retrieved from the Internet <https://newsreleases.sandia.gov/amd_collaboration/>., Jan. 26, 2023, 3 Pages.

(Continued)

*Primary Examiner* — Jerome Leboeuf

(74) *Attorney, Agent, or Firm* — FIG. 1 Patents

(57) ABSTRACT

A system may include a memory configured to store data of a first logic state in a ferroelectric capacitor when an electric polarization of the ferroelectric capacitor is in a first direction. A system may include a controller configured to erase the data from the memory by commanding the electric polarization of the ferroelectric capacitor in a second direction, opposite of the first direction and skipping a subsequent write operation of a null value to the memory.

20 Claims, 6 Drawing Sheets

(56) References Cited

OTHER PUBLICATIONS

"x86 Instruction Set Reference", STOS [retrieved May 20, 2023]. Retrieved from the Internet <https://c9x.me/x86/html/file_module_x86_id_306.html>., 2 Pages.

Khan, Samira Manabi , et al., "Sampling Dead Block Prediction for Last-Level Caches", IEEE/ACM International Symposium on Microarchitecture [retrieved May 20, 2023]. Retrieved from the Internet <https://web.archive.org/web/20170811225219id_/http://faculty.cse.tamu.edu/djimenez/pdfs/micro2010_sampler_dist.pdf>., Dec. 2010, 12 Pages.

Ros, Alberto , et al., "Efficient Self-Invalidation/Self-Downgrade for Critical Sections with Relaxed Semantics", IEEE Transactions on Parallel and Distributed Systems, vol. 28, No. 12 [retrieved May 20, 2023]. Retrieved from the Internet <, Dec. 1, 2017, 14 Pages.

* cited by examiner

100

Device 102

Processing Unit 104

Operating System 112

Applications 114

Memory Request 116

Memory Controller 106

Cache System 110

Cache Levels 122

Level 1 Cache 124(1)

Level "N" Cache 124(N)

Destructive Read Cache 126

Cache Line Array 128

Cache Tag 130

Cache Controller 132

Memory 108

Destructive Read Memory Array 118

Memory Cell 120

400 ——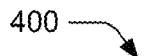

402
Receive, at a controller, a request for performing a read operation at a memory that stores data via a ferroelectric material based on a polarization direction of the ferroelectric material

404
Operate, by the controller, a data bus in a read-mode

406
Perform the read operation of data at the memory by applying an electric field across the ferroelectric material in a read direction that corresponds to a reset state of the ferroelectric material

408
Data retention at the memory desired?

YES

NO

410
Operate, by the controller, the data bus in a write-mode

414
Skip a write-back process to the memory

412
Perform a write operation of the data by applying an electric field across the ferroelectric material in a write direction, opposite of the read direction

416
Operate the data bus in the read-mode until a write request is received at the controller

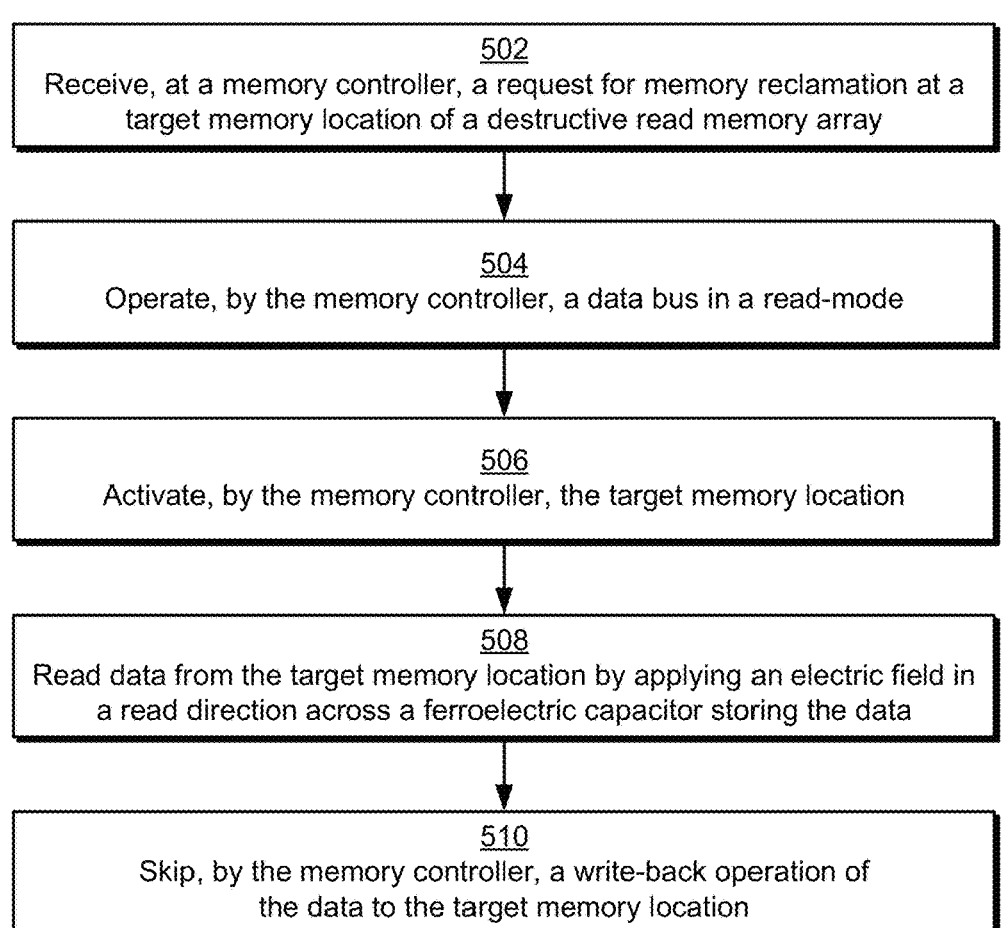

502
Receive, at a memory controller, a request for memory reclamation at a target memory location of a destructive read memory array 504
Operate, by the memory controller, a data bus in a read-mode 506
Activate, by the memory controller, the target memory location 508
Read data from the target memory location by applying an electric field in a read direction across a ferroelectric capacitor storing the data 510
Skip, by the memory controller, a write-back operation of the data to the target memory location

FIG. 5

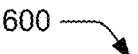
600
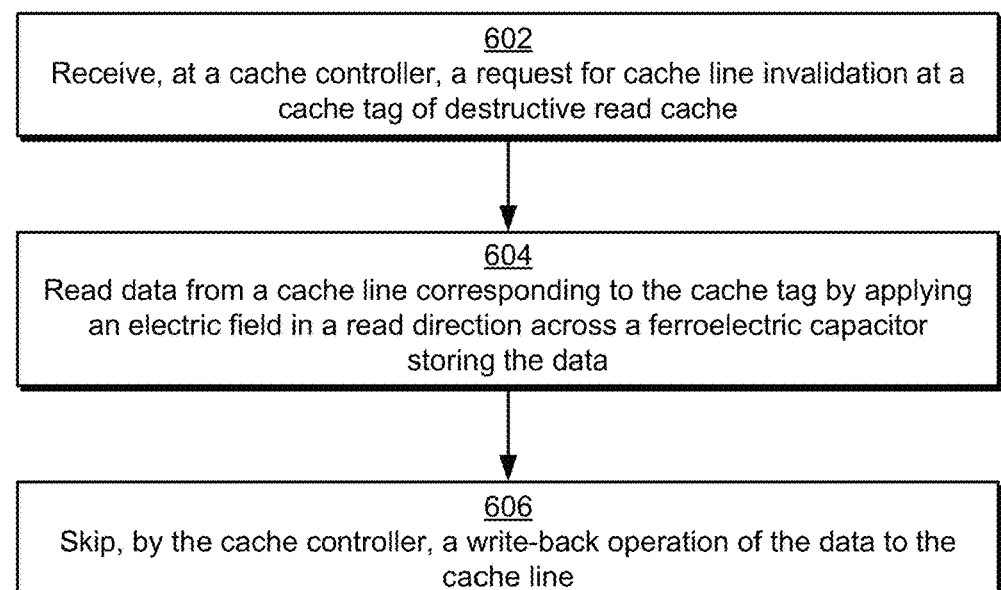
602
Receive, at a cache controller, a request for cache line invalidation at a cache tag of destructive read cache
604
Read data from a cache line corresponding to the cache tag by applying an electric field in a read direction across a ferroelectric capacitor storing the data
606
Skip, by the cache controller, a write-back operation of the data to the cache line
FIG. 6

EFFICIENT MEMORY OPERATION USING A DESTRUCTIVE READ MEMORY ARRAY

BACKGROUND

Memory devices and associated memory controllers are employed by computing systems to manage data storage as well as how these data are made available to processing devices, e.g., central processing units, graphics processing units, auxiliary processing units, parallel accelerated processor, and so forth. As such, efficiency in data storage directly affects operation of these devices, examples of which include processing speed, bandwidth, and power consumption. Accordingly, techniques have been developed to expand the ways in which data are stored by memory devices. Conventional techniques to do so, however, introduce additional challenges that cause these memory devices to fail in real-world scenarios.

BRIEF DESCRIPTION OF THE DRAWINGS

The detailed description is described with reference to the accompanying figures.

FIG. 4 is a flow diagram depicting an algorithm as a step-by-step procedure in an example of executing a read operation of data stored at a destructive read memory.

FIG. 5 is a flow diagram depicting an algorithm as a step-by-step procedure in an example of executing a memory reclamation process at a destructive read memory array.

FIG. 6 is a flow diagram depicting an algorithm as a step-by-step procedure in an example of executing a cache invalidation process at a destructive read cache.

DETAILED DESCRIPTION

Overview

Figure 1:
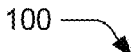
FIG. 1 is a block diagram of a non-limiting example system configured to perform efficient memory operation using a destructive read memory array.

Data storage has a direct effect on overall operation of computing devices. Because of this, techniques have been developed to expand the ways in which data are stored by these devices. However, in some instances these techniques also introduce challenges, which hinder operation in real world scenarios due to, for example, memory inefficiency and component wear. By way of example, it is desired to find suitable alternatives for dynamic random-access memory (DRAM) or other main memory components due to the need for memory refreshing to the data leakage that occurs with DRAM. That is, DRAM utilizes a dielectric capacitor to store data based on charge, but the charge on the dielectric capacitor gradually leaks away over time. A memory refresh is performed to restore the dielectric capacitor's charge. This also makes DRAM a volatile memory type, meaning that it loses its data when power is removed.

Ferroelectric random-access memory (FeRAM) has been explored as an alternative to DRAM due to its non-volatility. FeRAM includes ferroelectric capacitors rather than dielectric capacitors. A ferroelectric capacitor stores data based on an electric polarization state of a ferroelectric layer in the ferroelectric capacitor. The electric polarization state remains even when power is removed, which achieves the non-volatility. However, a read operation of the ferroelectric capacitor is destructive in nature. That is, the act of reading data from the ferroelectric capacitor includes changing the electric polarization state in the ferroelectric layer, which causes the data to no longer be stored. As such, read operations of FeRAM include an associated write-back process in order to maintain storage of the data in the FeRAM. The write-back process creates a performance and power overhead that has prevented FeRAM from being widely adapted.

To overcome these problems, efficient memory operation using a destructive read memory array is described. In accordance with the described techniques, system services like memory scrubbing and page zeroing (e.g., where data in a memory location is replaced with null values) during, for example, memory reclamation and deallocation are optimized so that efficiency gains during these processes offset the performance and power overhead of the write-back process, thus enabling FeRAM to be used as a DRAM replacement without sacrificing computing performance and energy efficiency. Moreover, FeRAM is usable as a static random-access memory (SRAM) replacement for a last-level cache, enabling cache invalidation scenarios where a cache tag is cleared of data to be optimized similarly.

The techniques described herein include processes (e.g., algorithms) that differ from conventional memory reclamation and cache invalidation processes to improve processing efficiency and power consumption in a number of ways. For example, during a conventional memory reclamation process, a memory controller first switches a data bus into a read-mode, commands data to be read from an off-chip target memory location to an on-chip location, switches the data bus into a write-mode, and then commands the null value (e.g., zero) to be written back from the on-chip location to the off-chip target memory location. Each switch of the data bus between the read-mode and the write-mode occurs over a time interval tWR and increases wear on the data bus.

In contrast, the techniques described herein include reading the data from the destructive read memory array (e.g., FeRAM) without bringing the data on-chip and without writing back null values. Because of this, the data bus is not repeatedly switched between the read-mode and the write-mode, which reduces the occurrence of the time interval tWR and decreases wear on the data bus. Because the null value write operation is not performed, the memory controller has increased bandwidth to perform read operations at other memory locations, which further increases processing and energy efficiency. In addition, memory refresh operations are not performed at the destructive read memory array because the destructive read memory array does not suffer from data leakage, which further decreases power consumption and component wear.

Moreover, memory security is increased by efficiently utilizing the destructive reads of the destructive read memory array. In conventional page zeroing processes, reclaimed memory pages are updated with random values that are different from the previous resident data. Since the techniques described herein utilize implicit zeroing of the memory pages, the techniques described herein ensure that the values are different from the prior data by causing the data to be erased and the memory pages reset.

Similarly, in a scenario where the destructive read memory array is used as a last-level cache, cache line invalidation is performed by reading data from a target cache line without writing back null values to the target cache line, as is performed during conventional cache invalidation processes. This increases available cache bandwidth because ports are not busy performing the null value write-back and decreases energy consumption and component wear. The increased cache bandwidth results in faster processing speeds and an overall improved performance. A variety of other instances are also contemplated, examples of which are described in the following discussion and shown using corresponding figures.

In some aspects, the techniques described herein relate to a system including a memory configured to store data of a first logic state in a ferroelectric capacitor when an electric polarization of the ferroelectric capacitor is in a first direction, and a controller configured to erase the data from the memory by commanding the electric polarization of the ferroelectric capacitor in a second direction, opposite to the first direction, and skipping a subsequent write operation of a null value to the memory.

In some aspects, the techniques described herein relate to a system, wherein the ferroelectric capacitor includes a ferroelectric layer positioned between a top conductive plate and a bottom conductive plate, and wherein the first direction includes the electric polarization of the ferroelectric layer toward the bottom plate.

In some aspects, the techniques described herein relate to a system, wherein commanding the electric polarization of the ferroelectric capacitor in the second direction, opposite to the first direction, includes commanding a voltage pulse at the bottom plate, and wherein the second direction includes the electric polarization of the ferroelectric layer toward the top plate.

In some aspects, the techniques described herein relate to a system, wherein the controller is further configured to read data from the memory by identifying stored data of the first logic state in response to receiving an indication of a current pulse while commanding the electric polarization of the ferroelectric capacitor in the second direction, and identifying stored data of a second logic state in response to not receiving the indication of the current pulse while commanding the electric polarization of the ferroelectric capacitor in the second direction.

In some aspects, the techniques described herein relate to a system, further including a processor executing an operating system, and wherein the controller is configured to erase the data from the ferroelectric capacitor in response to a memory reclamation request from the operating system.

In some aspects, the techniques described herein relate to a system, further including a data bus that communicatively couples the controller and the memory, and wherein the controller is further configured to perform operations including operating the data bus in a read-mode of operation while erasing the data from the memory, and executing a read request at another memory location while operating the data bus in the read-mode of operation, without switching the data bus to a write-mode of operation after erasing the data from the memory and before executing the read request.

In some aspects, the techniques described herein relate to a system, wherein the memory is a cache line of a last-level cache, and wherein the controller is configured to erase the data from the memory in response to a cache line invalidation request.

In some aspects, the techniques described herein relate to a system, wherein the memory is a memory cell of a ferroelectric random-access memory array.

In some aspects, the techniques described herein relate to a system including a capacitor configured to be in one of a set state where the capacitor stores data and a reset state where the capacitor stores a null value based on a polarization direction of a ferroelectric layer of the capacitor, and a controller configured to perform operations including receiving a request to erase the data from the capacitor while the capacitor is in the set state, and in response to receiving the request, causing a reversal of the polarization direction to transition the capacitor to the reset state without performing a write operation of the null value to the capacitor.

In some aspects, the techniques described herein relate to a system, wherein the ferroelectric layer is positioned between a top conductive plate that is electrically connected to a bitline via a transistor and a bottom conductive plate.

In some aspects, the techniques described herein relate to a system, wherein the polarization direction of the ferroelectric layer is toward the bottom conductive plate in the set state and toward the top conductive plate in the reset state.

In some aspects, the techniques described herein relate to a system, wherein causing the reversal of the polarization direction to transition the capacitor to the reset state without performing the write operation of the null value to the capacitor includes commanding, by the controller, a voltage pulse to be applied to the bottom conductive plate while biasing the top conductive plate at a reference voltage, and not commanding, by the controller, a subsequent voltage pulse to be applied to the top conductive plate while biasing the bottom conductive plate at the reference voltage.

In some aspects, the techniques described herein relate to a system, wherein the polarization direction of the ferroelectric layer is in a first direction during the reset state and is in a second direction, opposite to the first direction, during the set state.

In some aspects, the techniques described herein relate to a system, wherein causing the reversal of the polarization direction to transition the capacitor to the reset state without performing the write operation of the null value to the capacitor includes commanding, by the controller, application of an electric field across the ferroelectric layer in the first direction, and not commanding, by the controller, a subsequent application of the electric field across the ferroelectric layer in the second direction.

In some aspects, the techniques described herein relate to a system, wherein the controller is further configured to perform operations including receiving a write request to store new data in the capacitor while the capacitor is in the reset state, and in response to receiving the write request, causing the polarization direction of the ferroelectric layer to change from the first direction to the second direction.

In some aspects, the techniques described herein relate to a system, wherein causing the polarization direction of the ferroelectric layer to change from the first direction to the second direction includes causing, by the controller, application of an electric field across the ferroelectric layer in the second direction.

In some aspects, the techniques described herein relate to a method including receiving, at a controller, a request to erase data at a memory location that stores the data using a ferroelectric capacitor, and commanding, by the controller, a read operation of the memory location to generate a null value at the memory location without an associated null value write operation to the memory location to erase the data at the memory location.

In some aspects, the techniques described herein relate to a method, wherein the ferroelectric capacitor includes a ferroelectric layer positioned between a top conductive plate and a bottom conductive plate, and the read operation includes commanding a voltage pulse at the bottom conductive plate via a bitline while biasing the top conductive plate at a reference voltage via a control gate of a transistor, and sensing a voltage differential across the ferroelectric layer via a sense amplifier electrically connected to the bitline.

In some aspects, the techniques described herein relate to a method, wherein the read operation further includes commanding, by the controller, a data bus to operate in a read-mode.

In some aspects, the techniques described herein relate to a method, wherein the request to erase the data at the memory location is a memory reclamation request when the memory location is a main memory of a device or is a cache line invalidation request when the memory location is a cache line of the device.

FIG. 1 is a block diagram of a non-limiting example system 100 configured to perform efficient memory operation using a destructive read memory array. The system 100 includes a device 102 having a processing unit 104, a memory controller 106, a memory 108, and a cache system 110 that are communicatively coupled, one to another. The device 102 is configurable in a variety of ways, non-liming examples of which include computing devices, servers, mobile devices (e.g., wearables, mobile phones, tablets, laptops), processors (e.g., graphics processing units, central processing units, and accelerators), digital signal processors, disk array controllers, hard disk drive host adapters, memory cards, solid-state drives, wireless communications hardware connections, Ethernet hardware connections, switches, bridges, network interface controllers, and other apparatus configurations. It is to be appreciated that in various implementations, the device 102 is configured as any one or more of those devices listed just above and/or a variety of other devices without departing from the spirit or scope of the described techniques.

In the illustrated example, the processing unit 104 executes software (e.g., an operating system 112, applications 114, etc.) to issue a memory request 116 to the memory controller 106. The memory request 116 is configurable to cause storage (e.g., programming) of data to the memory 108 and/or the cache system 110 as a write request. Alternatively, the memory request 116 is configurable to read data from the memory 108 and/or the cache system 110 as a read request. Moreover, the processing unit 104 is representative of functionality of the device 102 implemented in hardware that performs operations, e.g., based on instructions received through execution of the software. In at least one implementation, the processing unit 104 includes more than one core, such as when the processing unit 104 is a multi-core processor.

The memory 108 is a device or system that is used to store information, such as for use in the device 102 (e.g., by the processing unit 104). In some cases, "memory" corresponds to a portion of the device or system used to store information, such as a memory page, a memory row, a memory cell, or a cache line. In other instances, "memory" corresponds to the device or system as a whole, such as the memory 108. The memory 108 is the main memory of the device 102 and includes a destructive read memory array 118. The destructive read memory array 118 is configured such that a read operation irreversibly alters or destroys the data being read from a given memory location. In one or more implementations, the memory 108 is ferroelectric random-access memory (FeRAM), where data is stored within memory cells that utilize polarization properties of a ferroelectric material to store data. As an example of this, the system 100 shown in FIG. 1 includes a memory cell 120. Ellipses denote that more than one memory cell 120 is present. In an example scenario, data is read from and written to the memory cell 120 by applying electrical voltage pulses to change the polarization state of the ferroelectric material. Moreover, in one or more implementations, the destructive read memory array 118 is configured to retain data even while power to the device 102 is turned off. For example, as long as an electric field is not supplied across the ferroelectric material, written data will be held without leakage or need of refresh for a longer period of time than conventional semiconductor random-access memory types, such as DRAM (e.g., dynamic random-access memory) that leak away data over time. Hence, the destructive read memory array 118 exhibits non-volatile properties. Additional details regarding example components of the memory cell 120 that enable the non-volatile properties and the destructive reads will be described herein, for example, with respect to FIGS. 2A and 2B.

The memory cells, including the memory cell 120, are organized in a matrix-like structure, with rows and columns forming addressable units within the destructive read memory array 118. In one or more implementations, the destructive read memory array 118 has an ultra-dense architecture that achieves a higher than conventional density of data storage within a given physical space. By way of example, the data storage density is higher in the destructive read memory array 118 than conventional semiconductor random-access memory types, such as SRAM (e.g., static random-access memory). Moreover, in at least one implementation, the memory cells of the destructive read memory array 118 are organized into memory pages. A memory page refers to a fixed-size block of memory (e.g., a contiguous range of memory addresses) that is used as a unit for memory management and data storage, e.g., by the memory controller 106. The destructive read memory array 118 is configurable in a variety of ways without departing from the spirit or scope of the described techniques.

The cache system 110 includes a plurality of cache levels 122, examples of which are illustrated as a level 1 cache 124(1) through a level "N" cache 124(N). The cache system 110 is configurable in a variety of ways (e.g., in hardware) to address a variety of processing unit 104 configurations, such as a central processing unit cache, graphics processing unit cache, parallel processor unit cache, digital signal processor cache, and so forth. Configuration of the cache levels 122 is utilized to take advantage of a variety of locality factors. Spatial locality is used to improve operation in situation in which data is requested that is stored physically close to data that is a subject of a previous request. Temporal locality is used to address scenarios in which data that has already been requested will be requested again.

In cache operations, a "hit" occurs to a cache level when data that are subject of a load operation are available via the cache level, and a "miss" occurs when the desired data are not available via the cache level. When employing multiple cache levels, requests proceed through successive cache levels 122 until the data are located. If the data are not located in the plurality of cache levels 122, the main memory (e.g., the destructive read memory array 118) is accessed. The level "N" cache 124(N) is a last-level cache that is the closest cache to the destructive read memory array 118 and is the highest-level cache in the hierarchy of the cache levels 122. In the present example, the level "N" cache 124(N) is a destructive read cache 126 that is managed by a cache controller 132. The destructive read cache 126 includes a cache line array 128 that is similar in structure to the destructive read memory array 118. For example, the cache line array 128 includes a plurality of cache lines arranged in a matrix-like structure, with rows and columns forming addressable units within the destructive read cache 126. In one or more implementations, a cache line of the cache line array 128 is the smallest unit of data that is stored and transferred within the destructive read cache 126 and includes a contiguous block of memory locations that are fetched from the destructive read memory array 118 and stored in the destructive read cache 126. The cache lines of the cache line array 128 include associated metadata, such as a cache tag 130 illustrated in FIG. 1, that store information regarding, e.g., a memory address and attributes of data stored in the corresponding cache line. In one or more implementations, individual data storage blocks of each cache line include a same or similar structure to the memory cell 120 for storing data.

It is to be appreciated that in at least one variation, the device 102 includes the destructive read cache 126 and a conventional non-volatile memory (e.g., DRAM) as the main memory instead of the destructive read memory array 118. In another variation, the device 102 includes the destructive read memory array 118 and another type of data storage device, such as SRAM, as the level "N" cache 124(N). As such, the device 102 may be configured in a variety of ways to utilize destructive memory reads without departing from the spirit or scope of the described techniques.

The memory controller 106 is representative of functionality of the processing unit 104 to execute instructions for managing data at the destructive read memory array 118 and the cache system 110. In various implementations, the memory controller 106 executes instructions and corresponding operations that involve writing data to the destructive read cache 126 and/or the destructive read memory array 118, such as in response to the memory request 116. For example, data are stored to the cache system 110 and/or the destructive read memory array 118 in response to store instructions executed by the memory controller 106. The process of storing data is also referred to herein as a write operation. Additionally or alternatively, the memory controller 106 executes instructions and corresponding operations that involve reading data from the destructive read cache 126 and/or the destructive read memory array 118 in response to the memory request 116. For example, data are fetched from the cache system 110 and/or the destructive read memory array 118 and loaded to processing unit 104 for use in various program executions in response to load instructions executed by the memory controller 106. The process of fetching data is also referred to herein as a read operation.

In one or more implementations, the cache controller 132 is a hardware component that includes functionality for managing operations of the cache system 110, such as by facilitating efficient data transfer between the processing unit 104 and the plurality of cache levels 122. By way of example, the cache controller 132 configures the plurality of cache levels 122 and, in combination with the memory controller 106, executes the memory request 116. In the case of a cache "hit," the cache controller 132 retrieves the requested data from the corresponding cache level 122 and provides the data to the processing unit 104. In the case of a cache "miss," the cache controller 132 coordinates with the memory controller 106 to fetch the requested data from the destructive read memory array 118 and optionally stores the requested data in the plurality of cache levels 122 for future cache access. As such, data storage in the plurality of cache levels 122 is controlled by hardware (e.g., the cache controller 132) rather than software (e.g., the operating system 112), at least in one implementation.

If the read data is to be retained by the destructive read cache 126 or the destructive read memory array 118, the read data is written back to the corresponding memory (e.g., the destructive read cache 126 or the destructive read memory array 118) via a subsequent write operation executed by the memory controller 106. If the read data is not to be retained, such as when data zeroing (e.g., setting memory contents to zero, or a null value) or cache invalidation is requested, the subsequent write operation is not performed. In contrast, conventional memory reclamation processes include writing back zeros to a corresponding row of memory cells 120. Similarly, conventional cache line invalidation is performed by writing zeros to the cache line, or at least to a valid bit of the cache line. As such, the techniques described herein enable data zeroing and cache line invalidation to be performed in a more efficient manner by not including a write request. Skipping the write-back decreases write-back latency, energy consumption, and component wear.

Moreover, because the read operation automatically results in zeroing of the corresponding memory cell 120 or cache line, security is improved because previous data are irretrievable. For example, conventional techniques for memory encryption use a cipher text, which is stored in memory. When read, the cipher text is no longer stored and is replaced by all zeros. Thus, the cipher text is erased in a manner that cannot be recovered.

Figure 2A:
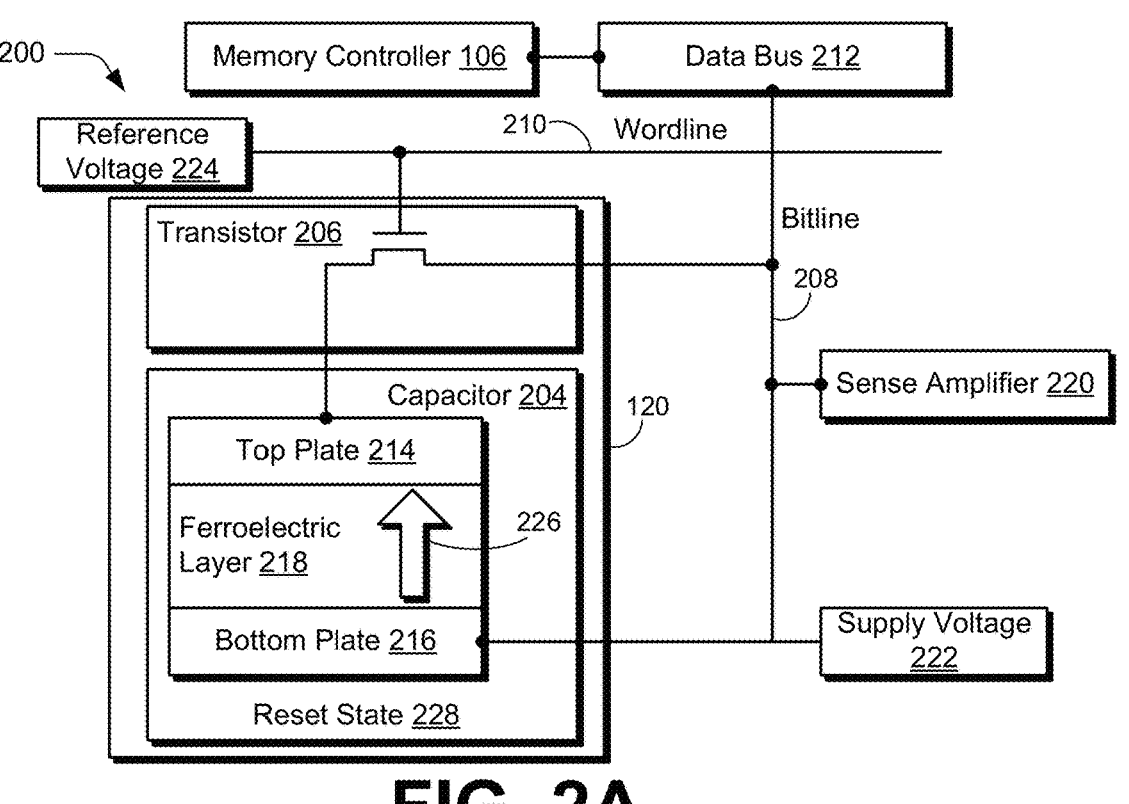
FIGS. 2A and 2B are block diagrams of a non-limiting example implementation of the memory cell of FIG. 1 in greater detail.
Figure 2B:
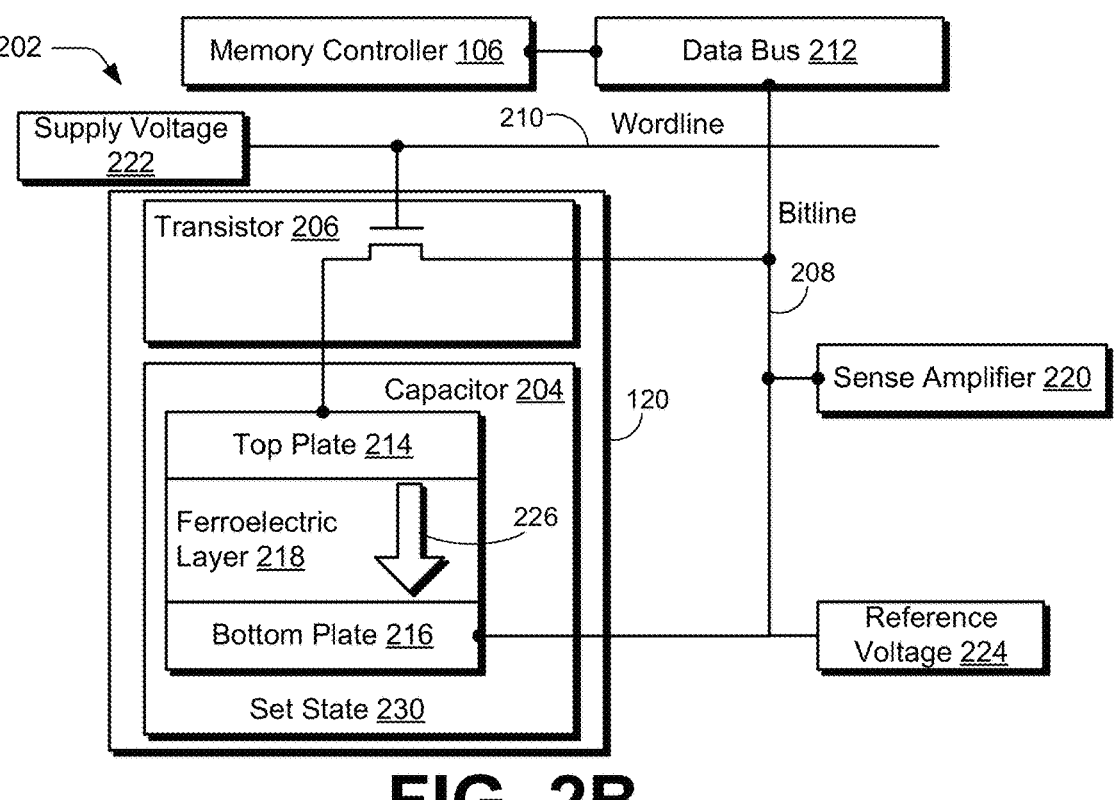

FIGS. 2A and 2B are block diagrams of a non-limiting example implementation of the memory cell 120 of FIG. 1 in greater detail. In particular, a non-limiting example implementation 200 shows the memory cell 120 during a read operation (FIG. 2A), and a non-limiting example implementation 202 shows the memory cell 120 during a write operation (FIG. 2B). In the example shown, the memory cell 120 includes a capacitor 204 and a transistor 206, giving the memory cell 120 a 1T-1C (e.g., one transistor, one capacitor) architecture. However, it is to be appreciated that other architectures are possible without departing from the spirit or scope of the described techniques. By way of example, in variations, the memory cell 120 includes a different number of transistors and/or capacitors or another type of architecture that enables destructive reads and non-transitory storage.

In at least one implementation, the memory cell 120 is in electronic communication with other components of the device 102 of FIG. 1, such as the memory controller 106. By way of example, the memory cell 120 is electronically connected to a bitline 208, a wordline 210, and a data bus 212. The bitline 208 is a signal line or conductor that carries data in and out of the memory cell 120, and the wordline 210 is a control signal that enables activation or deactivation of the memory cell 120 (and other memory cells in a given row) to enable the memory cell 120 to respond to incoming read or write signals. The data bus 212, for instance, provides a communication pathway that connects the destructive read memory array 118, including the memory cell 120, to other components of the device 102, such as the memory controller 106. The data bus 212 includes functionality that facilitates the transfer of data between the memory cell 120 and the other system components, such as the processing unit 104, according to timing and synchronization protocols of the data bus 212. In one or more implementations, the data bus 212 is configured to switch between a read-mode and a write-mode depending on a type of memory operation being performed. Due to this mode switching, a time interval occurs between completion of a read and initiation of a write, or vice versa, that is referred to as "tRW." The memory controller 106 transmits a command to the data bus 212 to switch the data bus 212 from the write-mode to the read-mode or from the read-mode to the write-mode, for instance.

In the example shown, the capacitor 204 includes a top plate 214 and a bottom plate 216 positioned on opposite sides of a ferroelectric layer 218. The top plate 214 and the bottom plate 216 are electrodes formed of a conductive material, such as platinum, iridium, or another conductive metal. The ferroelectric layer 218 is situated between the top plate 214 and the bottom plate 216 and exhibits the property of ferroelectricity, meaning that the ferroelectric layer 218 retains polarization or an electric field even after an applied field is removed. This property enables the ferroelectric layer 218 to store data as binary states of logic 1 or logic 0 according to a direction of the electric polarization. The top plate 214 is electrically connected to the wordline 210 and the bitline 208 via a control gate of the transistor 206. For example, activating the wordline 210 enables the transistor 206 to conduct. The bitline 208 is electrically coupled to the bottom plate 216 (e.g., directly electrically coupled to the bottom plate 216) as well as to a sense amplifier 220.

The polarization of the ferroelectric layer 218 is controlled by creating a voltage differential between the top plate 214 and the bottom plate 216. With reference to the non-limiting example implementation 200 of FIG. 2A, a read operation is performed by applying a voltage or voltage pulse of a supply voltage 222 to the bottom plate 216 while biasing the top plate 214 at a reference voltage 224, such as a ground or 0 volts (V). This creates an electric field in the ferroelectric layer 218 that polarizes the ferroelectric layer 218 in a first direction toward the top plate 214, as indicated by the direction of an arrow 226. This also creates a potential on the bitline 208 due to the connection of the bitline 208 to the top plate 214 and the bottom plate 216. Moreover, the bitline 208 is pre-charged to the reference voltage 224.

During the read operation, the voltage signals from the top plate 214 and the bottom plate 216 are transmitted to the sense amplifier 220 for amplification and detection. For example, the voltage difference resulting from the polarization state of the ferroelectric layer 218 is sensed and amplified by the sense amplifier 220 to determine the stored data. In at least one implementation, a current pulse is detected at the bitline 208 and amplified by the sense amplifier 220 when the polarization state of the ferroelectric layer 218 changes from a second direction, opposite of the first direction, to the first direction during the read operation, indicating a read of the logic 1 state. In contrast, when the ferroelectric layer 218 is already polarized in the first direction during the read operation, no current pulse is detected at the bitline 208, indicating a read of the logic 0 state. The read creates a reset state 228 in the memory cell 120 because the data is no longer stored in the capacitor 204. The reset state 228 is a state where no data is stored in the capacitor 204, e.g., corresponding to the logic 0 state of the binary. By way of example, the capacitor 204 stores a null value (e.g., zero) while in the reset state 228. As such, transitioning to the reset state 228 generates the null value in the capacitor 204 without an explicit write-back of the null value. It is to be appreciated that once the read operation is complete, the supply voltage 222 may no longer be applied.

With reference to the non-limiting example implementation 202 of FIG. 2B, a write operation is shown. The supply voltage 222 is applied to the top plate 214 while the bottom plate 216 is biased via the reference voltage 224. This reverses (e.g., flips) the electric field so that polarization of the ferroelectric layer 218 is in the second direction that is toward the bottom plate 216, as indicated by the direction of the arrow 226, and causes data of the logic 1 state to be stored in the memory cell 120 via the polarization state change. As such, upon completion of the write operation, the memory cell 120 has a set state 230. The set state 230 is a data storage state of the binary (e.g., a logic 1 state) where data (e.g., a non-zero value) is stored in the memory cell 120. It is to be appreciated that once the write operation is complete, the data is stored via the retained electric polarization of the ferroelectric layer 218 even when the supply voltage 222 is no longer applied. Thus, the capacitor 204 is transitioned between the reset state 228 and the set state 230 based on the polarization direction of the ferroelectric layer 218.

Although FIGS. 2A and 2B show the memory cell 120 of the destructive read memory array 118, it is to be appreciated that the destructive read cache 126 includes similar structures, including the capacitor 204 and the transistor 206, that function similarly. Thus, the above discussion of the memory cell 120 during read and write operations also applies to the destructive read cache 126.

Figure 3:
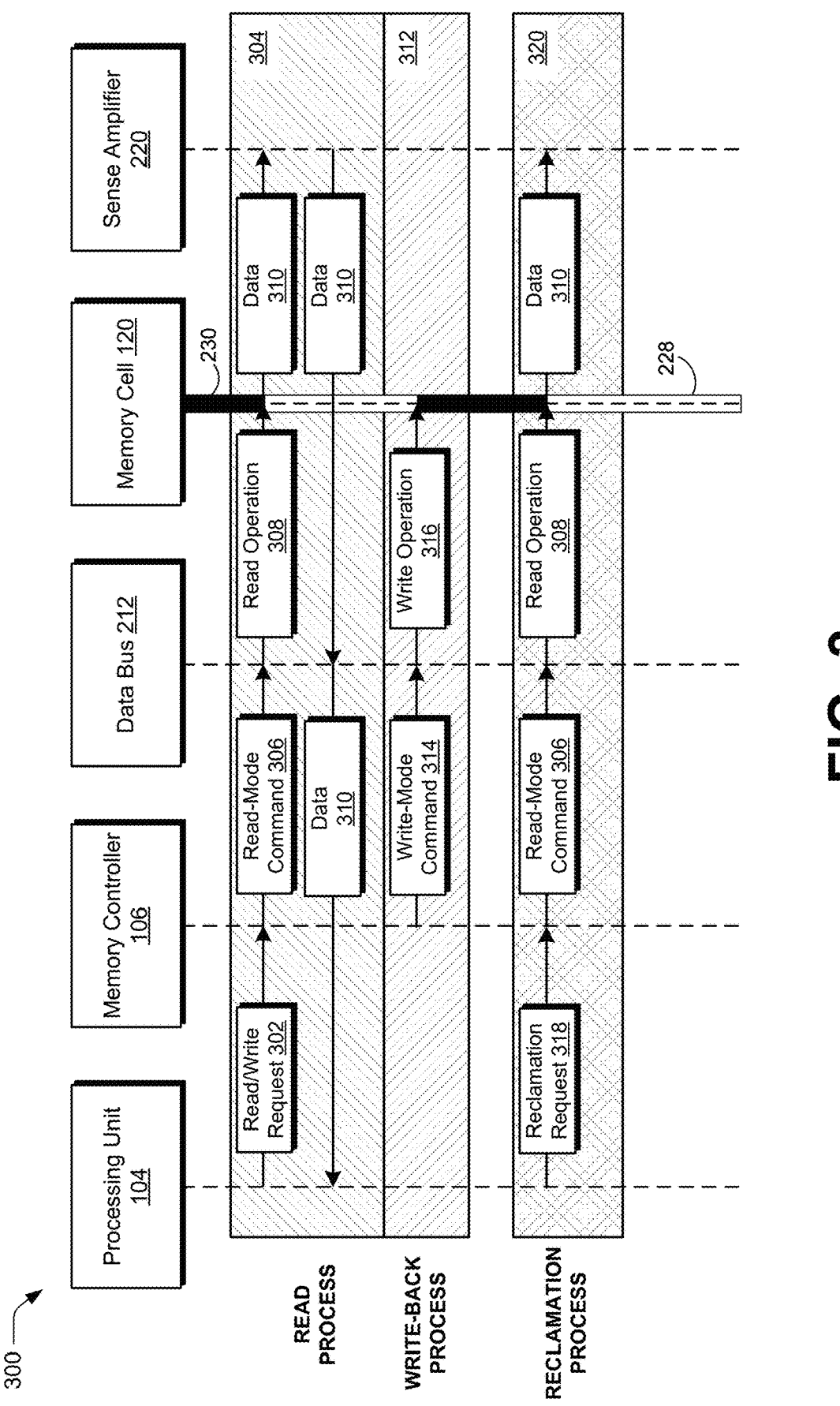
FIG. 3 depicts a non-limiting example in which a read/write process for accessing data for use in a computing operation is compared with a memory reclamation process.

FIG. 3 depicts a non-limiting example 300 in which a read/write process for accessing data for use in a computing operation is compared with a memory reclamation process. The example 300 includes, from FIG. 1, the processing unit 104, the memory controller 106, and the memory cell 120. The example 300 further includes the data bus 212 and the sense amplifier 220 from FIGS. 2A and 2B. Moreover, the reset state 228 of the memory cell 120, where the memory cell 120 does not store data, is indicated by white (e.g., non-shaded) bars in FIG. 3, and the set state 230, where memory cell 120 stores data, is indicated by black bars.

The example 300 includes a variety of example communications and operations between the processing unit 104, the memory controller 106, the data bus 212, the memory cell 120, and the sense amplifier 220. In this example 300, the communications and operations are positioned vertically based on time, such that communications and operations closer to a top of the example occur prior to communications or operations farther from the top of the example. It follows also that communications or operations closer to a bottom of the example occur subsequent to communications or operations farther from the bottom. The example 300 also depicts various phases and/or states of the device 102 or portions of the device 102. These phases and/or states are also positioned in the example 300 vertically based on time, such that phases or states closer to a top of the example occur prior to phases, states, or communications farther from the top.

Here, the example 300 depicts the processing unit 104 submitting a read/write request 302, which initiates a read process 304. The read/write request 302 includes a request to access data stored in the memory cell 120, e.g., of the destructive read memory array 118, while retaining the data in the memory cell 120. In response, the memory controller 106 transmits a read-mode command 306 to the data bus 212 to switch the data bus 212 to a read-mode of operation. It is to be appreciated that in at least one variation, the data bus 212 is already operating in the read-mode of operation, and so the memory controller 106 does not issue the read-mode command 306. The data bus 212 facilitates a read operation 308, such as the read operation described above with respect to FIG. 2A, that causes data 310 stored in the memory cell 120 to read into the sense amplifier 220, and the memory cell 120 switches to the reset state 228. From the sense amplifier 220, the data 310 is transmitted, e.g., via the data bus 212 to the processing unit 104 for usage by the processing unit 104 in applications 114 or by the operating system 112, for example.

Because the memory cell 120 no longer stores the data 310 due to the read process 304, a write-back process 312 that is subsequent to the read process 304 is initiated by the memory controller 106 transmitting a write-mode command 314 to the data bus 212. In response, the data bus 212 switches to a write-mode of operation. The data bus 212 facilitates the transfer of the data 310 back to the memory cell 120 via a write operation 316, such as the write operation described above with respect to FIG. 2B, and the memory cell 120 switches to the set state 230. Together, the read process 304 and the write-back process 312 provide a read/write process for accessing data for use by the processing unit 104.

At a later time, the processing unit 104 submits a reclamation request 318 to the memory controller 106 to zero out (e.g., create null or missing values in) pages in the destructive read memory array 118, including at the memory cell 120. In response, a reclamation process 320 is triggered, and the memory controller 106 transmits the read-mode command 306 to the data bus 212. The read-mode command 306 causes the data bus 212 to operate in the read-mode and facilitate the read operation 308, which causes the data 310 to be read to the sense amplifier 220. Because data is not requested during the reclamation process 320, the data 310 are not further transmitted via the data bus 212 and are not written back to the memory cell 120 (e.g., the write-back process 312 is skipped). As such, the memory cell 120 remains in the reset state 228 until new data is written to the memory cell 120 via a write request.

FIG. 4 is a flow diagram depicting an algorithm as a step-by-step procedure 400 in an example of executing a read operation of data stored at a destructive read memory. While the procedure 400 is a high-level method for executing read operations that is applicable to a plurality of different destructive ready memory types (e.g., the destructive read memory array 118 or the destructive read cache 126), additional procedures for leveraging specific types of destructive reads are also described herein, e.g., with respect to FIGS. 5 and 6.

A request for performing a read operation at a memory that stores data via a ferroelectric material based on a polarization direction of the ferroelectric material is received at a controller (block 402). By way of example, the controller is the memory controller 106 or the cache controller 132 depicted in FIG. 1. Moreover, the memory is at least a portion of the destructive read memory array 118 or the destructive read cache 126 of FIG. 1. In at least one implementation, the request for performing the read operation is included in a read/write request that includes writing back data to the memory after a read operation is executed in order to retain the data at the memory. Alternatively, the request for performing the read operation is not linked to a subsequent write operation, such as when the request for performing the read operation is part of a memory reclamation process of the destructive read memory array 118 or part of a cache line invalidation process performed on the destructive read cache 126 by the cache controller 132. Additional details regarding triggers of the memory reclamation process are described with respect to FIG. 5 (e.g., at block 502), and additional details regarding triggers of the cache line invalidation process are described with respect to FIG. 6 (e.g., at block 602).

As described herein, the memory (e.g., of the destructive read memory array 118 or the destructive read cache 126)

stores the data via the ferroelectric material, which is included in a capacitor (e.g., the capacitor 204). In particular, the ferroelectric material (e.g., the ferroelectric layer 218) stores data of a first logic state (e.g., logic 1) when the ferroelectric material is electrically polarized in a first direction via a temporary application of an electric field in the first direction during a write process. Once the write process is complete, the ferroelectric material stores the data even when the electric field is no longer applied. In contrast, the ferroelectric material stores a data of a second logic state (e.g., logic 0, or "null" data) when the ferroelectric material is electrically polarized in a second direction, opposite of the first direction.

A data bus is operated in a read-mode by the controller (block 404). By way of example, if the data bus is operating in a write-mode that facilitates data transfer to the memory, rather than data transfer from the memory, then the controller issues a command that switches the data bus from the write-mode to the read-mode. The process of switching the data bus from to the read-mode to occurs over a time interval tWR. Alternatively, if the data bus is already operating in the read-mode, the controller does not issue the command to switch the data bus to the read-mode.

The read operation of data at the memory is performed by applying an electric field across the ferroelectric material in a read direction that corresponds to a reset state of the ferroelectric material (block 406). By way of example, the read direction that corresponds to the reset state of the ferroelectric material is the second direction, and applying the electric field in the second direction includes applying a voltage pulse at the bottom plate 216. When the ferroelectric material is electrically polarized in the first direction and stores logic 1 data, applying the electric field in the second direction causes the electric polarization of the ferroelectric material to flip to the second direction and creates a current pulse at an electrically connected bitline (e.g., the bitline 208). When the ferroelectric material is already electrically polarized in the second direction and stores logic 0 data (e.g., null data), no current pulse occurs at the bitline. A sense amplifier electrically coupled to the bitline (e.g., the sense amplifier 220) detects a voltage differential across the ferroelectric material to read the data that was stored in the ferroelectric material to differentiate between logic 1 and logic 0 data. Moreover, because the ferroelectric material no longer includes the original polarization (e.g., in the first direction), the ferroelectric material no longer stores the data (e.g., the logic 1 data).

It is determined if data retention at the memory is desired (block 408). By way of example, data retention is desired when the request for performing the read operation is part of a read/write request. In contrast, data retention at the memory is not desired when the request for performing the read operation is part of a memory reclamation process or a cache line invalidation process.

In response to data retention at the memory being desired, the controller operates the data bus in the write-mode (block 410). By way of example, the controller issues a command that switches the data bus from the read-mode to the write-mode, which occurs over the time interval tWR. Alternatively, if the data bus is already operating in the read-mode, the controller does not issue the command to switch the data bus to the read-mode.

A write operation of the data is performed by applying an electric field across the ferroelectric material in a write direction, opposite of the read direction (block 412). By way of example, the write direction is the first direction corresponding to the first logic state, and applying the electric field in the write direction includes applying a voltage pulse at the top plate 214, which causes the electric polarization of the ferroelectric material to flip back to the first direction to store the data.

In contrast, if data retention at the memory is not desired, a write-back process to the memory is skipped (block 414). By way of example, the controller does not command the read data, or any other data (e.g., zeros), to be written to the memory subsequent to (e.g., immediately following) the read operation. As such, the memory is maintained in the reset state 228 where data is not stored in the memory.

The data bus is operated in the read-mode until a write request is received at the controller (block 416). By way of example, the controller may execute one or more additional read requests without switching the data bus between the read-mode and the write-mode, e.g., to write back zeros, and then back to the read-mode. As such, processing efficiency is increased (e.g., by not including additional tWR intervals), energy consumption is reduced, and wear on the components, including the data bus and the memory, is reduced.

FIG. 5 is a flow diagram depicting an algorithm as a step-by-step procedure 500 in an example of executing a memory reclamation process at a destructive read memory array.

A request for memory reclamation at a target memory location of a destructive read memory array is received by a memory controller (block 502). By way of example, the memory controller 106 receives the request for the memory reclamation from a hypervisor or other software component of the operating system 112. In at least one implementation, the request for memory reclamation is part of a zeroing task of the memory page that is performed once a software process terminates to ensure that data from the prior, terminated process are not leaked to the subsequent process when the memory page is assigned to the new process. Additionally or alternatively, the request for memory reclamation is part of a dynamic de-duplication process that is used to reduce an overall memory footprint. For example, the de-duplication process includes consolidating memory pages with the same values to one copy-on-write protected page before the other duplicate memory pages are zeroed out (e.g., erased) as part of the memory reclamation process. In at least one variation, the request for memory reclamation is part of a memory fragmentation-triggered page migration process requested by the hypervisor to compact memory. For instance, the page migration process includes migration from a source memory page to a destination memory page and then erasing data from the source page as a part of the memory reclamation process. In another variation, the request for memory reclamation is part of an explicit request for memory deallocation by applications 114.

A data bus is operated by the memory controller in a read-mode (block 504). By way of example, if the data bus 212 is operating in a write-mode that facilitates data transfer to the target memory location of the destructive read memory array 118, rather than data transfer from the destructive read memory array 118, then the memory controller 106 issues a command that switches the data bus 212 from the write-mode to the read-mode. Alternatively, if the data bus 212 is already operating in the read-mode, the memory controller 106 does not issue the command to switch the data bus 212 to the read-mode.

The target memory location is activated by the memory controller (block 506). By way of example, the memory controller 106 issues a command to apply a voltage to a wordline 210 associated with the target memory location (e.g., a row). This causes the transistor 206 to conduct, for example.

Data is read from the target memory location by applying an electric field in a read direction across a ferroelectric capacitor storing the data (block 508). By way of example, applying the electric field in the read direction includes applying a voltage pulse at the bottom plate 216. This causes the data to be read into the sense amplifier 220 and further causes the data to no longer be stored in the capacitor 204. For instance, if the ferroelectric layer 218 is in the logic 1 state (e.g., the set state 230), applying the electric field in the read direction causes the electric polarization of the ferroelectric layer 218 to flip. Thus, the target memory location is zeroed out to the reset state 228 without performing a write-back of a null value, as is performed when the target memory has non-destructive reads.

A write-back operation of the data to the target memory location is skipped by the memory controller (block 510). By way of example, because zeroing of the target memory is desired, no write-back is performed to retain the data at the target memory location.

The procedure 500 increases memory bandwidth and energy efficiency by leveraging the destructive read properties of the destructive read memory array 118. For example, the memory controller 106 does not switch the data bus 212 from the read-mode to the write-mode, thus avoiding the time interval tWR. Moreover, the memory controller 106 can service additional read requests at other memory locations. In addition, the memory controller 106 does not consume write bandwidth to record null values to the activated target memory location.

FIG. 6 is a flow diagram depicting an algorithm as a step-by-step procedure 600 in an example of executing a cache invalidation process at a destructive read cache.

A request for cache line invalidation at a cache tag of a destructive read cache is received at a cache controller (block 602). By way of example, cache line invalidation is triggered by a cache replacement policy during a fill operation or via a dead block eviction mechanism. A dead block, in this context, refers to a cache block that is considered "dead" or no longer useful because its contents are not expected to be accessed again. As such, dead block eviction is used to free up cache space by evicting (e.g., erasing) cache blocks that are not contributing to cache performance. In at least one variation, the cache line invalidation is triggered by a non-inclusive caching policy when data stored at the cache tag is sent to another cache level that is closer to the processing unit 104. Additionally or alternatively, the cache line invalidation is triggered by an external cache coherence operation, such as when the same cache line is found in the cache of another cache coherence domain and that cache coherence domain transitions to an exclusive state. In yet another variation, the cache line invalidation is triggered due to a corresponding store processing forwarding (SPF) entry being evicted from a memory subsystem of the processing unit 104. When an SPF entry is removed from the memory subsystem of the processing unit 104, any cache line associated with that entry is invalidated to reflect the fact that the data in the cache line may no longer be up-to-date or valid. In one or more other variations, the cache line invalidation is triggered by a cache flush operation, where the cache line is flushed and written back to the main memory (e.g., the destructive read memory array 118) to ensure coherence and persistence.

Data is read from a cache line corresponding to the cache tag by applying an electric field in a read direction across a ferroelectric capacitor storing the data (block 604). By way of example, applying the electric field in the read direction includes applying a voltage pulse at the bottom plate 216. This causes the data to be read into the sense amplifier 220 and further causes the data to no longer be stored in the capacitor 204. For instance, if the ferroelectric layer 218 is in the logic 1 state (e.g., the set state 230), applying the electric field in the read direction causes the electric polarization of the ferroelectric layer 218 to flip. Thus, the cache line is zeroed out to the reset state 228 without performing a write-back of zeros, as is performed when the cache component has non-destructive reads (e.g., when the capacitor is a dielectric capacitor rather than a ferroelectric capacitor).

A write-back operation of the data to the cache line is skipped by the cache controller (block 606). By way of example, because zeroing of the cache line is desired, no write-back is performed to retain the data at the cache line. Moreover, an explicit write-back of null values is not used due to the destructive read.

The procedure 600 increases cache bandwidth and energy efficiency by leveraging the destructive read properties of the destructive read cache 126. For example, the ports of the destructive read cache 126 are not busy writing back zeros to the cache tag, which decreases an occurrence of collision detect fails due to decreased traffic. This also improves an available cache controller 132 bandwidth for improved performance and increased energy efficiency.

It should be understood that many variations are possible based on the disclosure herein. Although features and elements are described above in particular combinations, each feature or element is usable alone without the other features and elements or in various combinations with or without other features and elements.

The various functional units illustrated in the figures and/or described herein (including, where appropriate, the device 102, the processing unit 104, the memory controller 106, the destructive read memory array 118, and the cache system 110) are implemented in any of a variety of different manners such as hardware circuitry, software or firmware executing on a programmable processor, or any combination of two or more of hardware, software, and firmware. The methods provided are implemented in any of a variety of devices, such as a general-purpose computer, a processor, or a processor core. Suitable processors include, by way of example, a general purpose processor, a special purpose processor, a conventional processor, a digital signal processor (DSP), a graphics processing unit (GPU), a parallel accelerated processor, a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

In one or more implementations, the methods and procedures provided herein are implemented in a computer program, software, or firmware incorporated in a non-transitory computer-readable storage medium for execution by a general-purpose computer or a processor. Examples of non-transitory computer-readable storage mediums include a read only memory (ROM), a random-access memory (RAM), a register, cache memory, semiconductor memory devices, magnetic media such as internal hard disks and removable disks, magneto-optical media, and optical media such as CD-ROM disks, and digital versatile disks (DVDs).

In the preceding description, the use of the same reference numerals in different drawings indicates similar or identical items.

Although the systems and techniques have been described in language specific to structural features and/or methodological acts, it is to be understood that the systems and techniques defined in the appended claims are not necessarily limited to the specific features or acts described. Rather, the specific features and acts are disclosed as example forms of implementing the claimed subject matter.

What is claimed is:

1. A system comprising:
a memory configured to store data of a first logic state in a ferroelectric capacitor when an electric polarization of the ferroelectric capacitor is in a first direction;
a data bus; and
a controller communicatively coupled to the memory by the data bus and configured to:
operate the data bus in a read-mode of operation;
while operating the data bus in the read-mode of operation, erase the data from the memory by:
commanding the electric polarization of the ferroelectric capacitor in a second direction, opposite to the first direction; and
skipping a subsequent write operation of a null value to the memory; and
maintain the data bus in the read-mode of operation for one or more read requests until a write request is received.

2. The system of claim 1, wherein the ferroelectric capacitor includes a ferroelectric layer positioned between a top conductive plate and a bottom conductive plate, and wherein the first direction includes the electric polarization of the ferroelectric layer from the top conductive plate toward the bottom conductive plate in response to applying a supply voltage to the top conductive plate.

3. The system of claim 2, wherein commanding the electric polarization of the ferroelectric capacitor in the second direction, opposite to the first direction, includes commanding a voltage pulse of the supply voltage at the bottom conductive plate, and wherein the second direction includes the electric polarization of the ferroelectric layer from the bottom conductive plate toward the top conductive plate in response to the voltage pulse.

4. The system of claim 1, further comprising a sense amplifier, and wherein the controller is further configured to read data from the memory by:
reading stored data of the first logic state from the sense amplifier in response to the sense amplifier detecting a current pulse during application of an electric field to the ferroelectric capacitor in the second direction; and
reading stored data of a second logic state from the sense amplifier in response to the sense amplifier not detecting the current pulse during application of the electric field to the ferroelectric capacitor in the second direction.

5. The system of claim 1, further comprising a processor executing an operating system, and wherein the controller is configured to erase the data from the ferroelectric capacitor in response to a memory reclamation request from the operating system.

6. The system of claim 1, wherein the one or more read requests include a read request at another memory location, and the controller is further configured to perform operations comprising:
executing the read request while operating the data bus in the read-mode of operation, without switching the data bus to a write-mode of operation after erasing the data from the memory and before executing the read request.

7. The system of claim 1, wherein the memory is a cache line of a last-level cache, and wherein the controller is configured to erase the data from the memory in response to a cache line invalidation request.

8. The system of claim 1, wherein the memory is a memory cell of a ferroelectric random-access memory array.

9. The system of claim 1, wherein to maintain the data bus in the read-mode of operation for the one or more read requests until the write request is received, the controller is further configured to:

continue operating the data bus in the read-mode of operation without switching the data bus to a write-mode of operation after erasing the data from the memory and before receiving the one or more read requests.

10. A system comprising:

a capacitor configured to be in one of a set state where the capacitor stores data and a reset state where the capacitor stores a null value based on a polarization direction of a ferroelectric layer of the capacitor;

a data bus; and a controller communicatively coupled to the data bus and configured to perform operations comprising:

receiving a request to erase the data from the capacitor while the capacitor is in the set state; and in response to receiving the request:

operating the data bus in a read-mode of operation;

causing a reversal of the polarization direction to transition the capacitor to the reset state without performing a write operation of the null value to the capacitor; and continuing to operate the data bus in the read-mode of operation after transitioning the capacitor to the reset state until a write request is received.

11. The system of claim 10, wherein:

the ferroelectric layer is positioned between a top conductive plate that is electrically connected to a bitline via a transistor and a bottom conductive plate;

the polarization direction of the ferroelectric layer in the set state is created via a supply voltage being applied to the top conductive plate while biasing the bottom conductive plate at a reference voltage; and the polarization direction of the ferroelectric layer in the reset state is created via the supply voltage being applied to the bottom conductive plate while biasing the top conductive plate at a reference voltage.

12. The system of claim 10, wherein the ferroelectric layer is positioned between a top conductive plate that is electrically connected to a bitline via a transistor and a bottom conductive plate, and wherein causing the reversal of the polarization direction to transition the capacitor to the reset state without performing the write operation of the null value to the capacitor includes:

commanding, by the controller, a voltage pulse to be applied to the bottom conductive plate while biasing the top conductive plate at a reference voltage; and not commanding, by the controller, a subsequent voltage pulse to be applied to the top conductive plate while biasing the bottom conductive plate at the reference voltage.

13. The system of claim 10, wherein the polarization direction of the ferroelectric layer is in a first direction during the reset state and is in a second direction, opposite to the first direction, during the set state, and wherein causing the reversal of the polarization direction to transition the capacitor to the reset state without performing the write operation of the null value to the capacitor includes:

commanding, by the controller, application of an electric field across the ferroelectric layer in the first direction; and not commanding, by the controller, a subsequent application of the electric field across the ferroelectric layer in the second direction.

14. The system of claim 13, wherein the controller is further configured to perform operations comprising:

receiving, as the write request, a request to store new data in the capacitor while the capacitor is in the reset state; and in response to receiving the write request:

operating the data bus in a write-mode of operation; and causing the polarization direction of the ferroelectric layer to change from the first direction to the second direction.

15. The system of claim 10, wherein the controller is further configured to perform operations comprising:

receiving a read request for another memory location while continuing to operate the data bus in the read-mode of operation after transitioning the capacitor to the reset state; and executing the read request while operating the data bus in the read-mode of operation, without switching the data bus to a write-mode of operation after transitioning the capacitor to the reset state and before executing the read request.

16. A method comprising:

receiving, at a controller, a request to erase data at a memory location that stores the data using a ferroelectric capacitor;

commanding, by the controller, a read operation of the memory location to generate a null value at the memory location without an associated null value write operation to the memory location to erase the data at the memory location;

operating a data bus in a read-mode of operation while generating the null value at the memory location; and continuing to operate the data bus in the read-mode of operation for one or more read requests until a write request is received.

17. The method of claim 16, wherein the ferroelectric capacitor includes a ferroelectric layer positioned between a top conductive plate and a bottom conductive plate, and the read operation comprises:

commanding a voltage pulse at the bottom conductive plate via a bitline while biasing the top conductive plate at a reference voltage via a control gate of a transistor; and sensing a voltage differential across the ferroelectric layer via a sense amplifier electrically connected to the bitline.

18. The method of claim 17, wherein sensing the voltage differential further comprises:

identifying, via the sense amplifier, a first logic state at the memory location in response to detecting a current pulse at the bitline; or identifying, via the sense amplifier, a second logic state at the memory location in response to not detecting a current pulse at the bitline.

19. The method of claim 16, wherein the request to erase the data at the memory location is a memory reclamation request when the memory location is a main memory of a device or is a cache line invalidation request when the memory location is a cache line of the device.

20. The method of claim 16, wherein continuing to operate the data bus in the read-mode of operation for the one or more read requests until the write request is received comprises:

executing a read request at another memory location while operating the data bus in the read-mode of operation, without switching the data bus to a write-mode of operation after generating the null value and before executing the read request.

\* \* \* \* \*